(12) United States Patent
Costa et al.

(10) Patent No.: US 9,502,328 B2
(45) Date of Patent: Nov. 22, 2016

(54) SILICON-ON-PLASTIC SEMICONDUCTOR DEVICE AND METHOD OF MAKING THE SAME

(71) Applicant: RF Micro Devices, Inc., Greensboro, NC (US)

(72) Inventors: Julio C. Costa, Oak Ridge, NC (US); David M. Shuttleworth, Greensboro, NC (US); Michael J. Antonell, Summerfield, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 14/529,870

(22) Filed: Oct. 31, 2014

(65) Prior Publication Data
US 2015/0115416 A1 Apr. 30, 2015

Related U.S. Application Data

(60) Provisional application No. 61/898,009, filed on Oct. 31, 2013.

(51) Int. Cl.
| | |
|---|---|
| *H01L 23/373* | (2006.01) |
| *H01L 27/12* | (2006.01) |
| *H01L 23/48* | (2006.01) |

(52) U.S. Cl.
CPC ....... *H01L 23/3737* (2013.01); *H01L 27/1203* (2013.01); *H01L 23/481* (2013.01); *H01L 2924/0002* (2013.01)

(58) Field of Classification Search
CPC . H01L 29/02; H01L 23/481; H01L 27/1203; H01L 23/3737; H01L 2924/0002
USPC ........................................................ 257/632
See application file for complete search history.

(56) References Cited

U.S. PATENT DOCUMENTS

| | | | |
|---|---|---|---|
| 4,093,562 | A | 6/1978 | Kishimoto |
| 4,366,202 | A | 12/1982 | Borovsky |

(Continued)

FOREIGN PATENT DOCUMENTS

| | | |
|---|---|---|
| CN | 103811474 A | 5/2014 |
| JP | 2006005025 A | 1/2006 |

(Continued)

OTHER PUBLICATIONS

Unkown Author, http://www.coolpolymers.com/dseries.asp, Oct. 31, 2007.*

(Continued)

*Primary Examiner* — Fernando L Toledo
*Assistant Examiner* — Adam S Bowen
(74) *Attorney, Agent, or Firm* — Withrow & Terranova, P.L.L.C.

(57) ABSTRACT

A semiconductor device that does not produce nonlinearities attributed to a high resistivity silicon handle interfaced with a dielectric region of a buried oxide (BOX) layer is disclosed. The semiconductor device includes a semiconductor stack structure with a first surface and a second surface wherein the second surface is on an opposite side of the semiconductor stack structure from the first surface. At least one device terminal is included in the semiconductor stack structure and at least one electrical contact extends from the second surface and is electrically coupled to the at least one device terminal. The semiconductor stack is protected by a polymer disposed on the first surface of the semiconductor stack. The polymer has high thermal conductivity and high electrical resistivity.

25 Claims, 6 Drawing Sheets

(56) References Cited

U.S. PATENT DOCUMENTS

| | | | |
|---|---|---|---|
| 5,061,663 A * | 10/1991 | Bolt | C04B 35/581 |
| | | | 423/412 |
| 5,069,626 A | 12/1991 | Patterson et al. | |
| 5,391,257 A | 2/1995 | Sullivan et al. | |
| 5,459,368 A | 10/1995 | Onishi et al. | |
| 5,646,432 A | 7/1997 | Iwaki et al. | |
| 5,699,027 A | 12/1997 | Tsuji et al. | |
| 5,709,960 A | 1/1998 | Mays et al. | |
| 5,831,369 A | 11/1998 | Fürbacher et al. | |
| 5,920,142 A | 7/1999 | Onishi et al. | |
| 6,072,557 A | 6/2000 | Kishimoto | |
| 6,235,554 B1 | 5/2001 | Akram et al. | |
| 6,236,061 B1 | 5/2001 | Walpita | |
| 6,426,559 B1 | 7/2002 | Bryan et al. | |
| 6,446,316 B1 | 9/2002 | Fürbacher et al. | |
| 6,578,458 B1 | 6/2003 | Akram et al. | |
| 6,649,012 B2 | 11/2003 | Masayuki et al. | |
| 6,943,429 B1 | 9/2005 | Glenn et al. | |
| 6,992,400 B2 | 1/2006 | Tikka et al. | |
| 7,042,072 B1 | 5/2006 | Kim et al. | |
| 7,109,635 B1 | 9/2006 | McClure et al. | |
| 7,288,435 B2 | 10/2007 | Aigner et al. | |
| 7,307,003 B2 | 12/2007 | Reif et al. | |
| 7,393,770 B2 | 7/2008 | Wood et al. | |
| 7,427,824 B2 | 9/2008 | Iwamoto et al. | |
| 7,596,849 B1 | 10/2009 | Carpenter et al. | |
| 7,635,636 B2 | 12/2009 | McClure et al. | |
| 7,714,535 B2 | 5/2010 | Yamazaki et al. | |
| 7,855,101 B2 | 12/2010 | Furman et al. | |
| 7,868,419 B1 | 1/2011 | Kerr et al. | |
| 7,960,218 B2 | 6/2011 | Ma et al. | |
| 8,183,151 B2 | 5/2012 | Lake | |
| 8,503,186 B2 | 8/2013 | Lin et al. | |
| 8,643,148 B2 | 2/2014 | Lin et al. | |
| 8,772,853 B2 | 7/2014 | Hong et al. | |
| 8,835,978 B2 | 9/2014 | Mauder et al. | |
| 8,921,990 B2 | 12/2014 | Park et al. | |
| 2001/0004131 A1 | 6/2001 | Masayuki et al. | |
| 2004/0166642 A1 | 8/2004 | Chen et al. | |
| 2004/0219765 A1 | 11/2004 | Reif et al. | |
| 2005/0037595 A1 | 2/2005 | Nakahata | |
| 2005/0079686 A1 | 4/2005 | Aigner et al. | |
| 2005/0212419 A1 | 9/2005 | Vazan et al. | |
| 2006/0108585 A1 | 5/2006 | Gan et al. | |
| 2006/0261446 A1 | 11/2006 | Wood et al. | |
| 2007/0020807 A1 | 1/2007 | Geefay et al. | |
| 2007/0069393 A1 | 3/2007 | Asahi et al. | |
| 2007/0190747 A1 | 8/2007 | Humpston et al. | |
| 2007/0252481 A1 | 11/2007 | Iwamoto et al. | |
| 2007/0276092 A1 * | 11/2007 | Kanae | C08F 210/02 |
| | | | 525/208 |
| 2008/0050852 A1 | 2/2008 | Hwang et al. | |
| 2008/0272497 A1 | 11/2008 | Lake | |
| 2008/0315372 A1 | 12/2008 | Kuan et al. | |
| 2009/0014856 A1 | 1/2009 | Knickerbocker | |
| 2010/0012354 A1 | 1/2010 | Hedin et al. | |
| 2010/0045145 A1 | 2/2010 | Tsuda | |
| 2010/0081232 A1 | 4/2010 | Furman et al. | |
| 2010/0081237 A1 | 4/2010 | Wong et al. | |
| 2010/0173436 A1 | 7/2010 | Ouellet et al. | |
| 2011/0026232 A1 * | 2/2011 | Lin | H01L 21/76898 |
| | | | 361/760 |
| 2011/0036400 A1 * | 2/2011 | Murphy | H01L 31/0392 |
| | | | 136/256 |
| 2011/0068433 A1 | 3/2011 | Kim et al. | |
| 2011/0102002 A1 * | 5/2011 | Riehl | B82Y 30/00 |
| | | | 324/693 |
| 2012/0068276 A1 | 3/2012 | Lin et al. | |
| 2012/0094418 A1 | 4/2012 | Grama et al. | |
| 2013/0015429 A1 | 1/2013 | Hong et al. | |
| 2013/0299871 A1 | 11/2013 | Mauder et al. | |
| 2014/0168014 A1 | 6/2014 | Chih et al. | |
| 2014/0264818 A1 | 9/2014 | Lowe, Jr. et al. | |
| 2014/0327150 A1 | 11/2014 | Jung et al. | |
| 2015/0235990 A1 | 8/2015 | Cheng et al. | |
| 2015/0235993 A1 | 8/2015 | Cheng et al. | |
| 2015/0255368 A1 | 9/2015 | Costa | |
| 2015/0364344 A1 | 12/2015 | Yu et al. | |

FOREIGN PATENT DOCUMENTS

| | | | |
|---|---|---|---|
| JP | 2007227439 A | 9/2007 | |
| JP | 2008235490 A | 10/2008 | |
| JP | 2008279567 A | 11/2008 | |
| JP | 2009026880 A | 2/2009 | |
| JP | 2009530823 A | 8/2009 | |
| WO | 2007074651 A1 | 7/2007 | |

OTHER PUBLICATIONS

Author Unknown, "CoolPoly E5107 Thermally Conductive Polyphenylene Sulfide (PPS)," Cool Polymers, Inc., Aug. 8, 2007, 1 page, http://coolpolymers.com/Files/DS/Datasheet_e5107.pdf.

Yamanaka, A., et al., "Thermal Conductivity of High-Strength Polytheylene Fiber and Applications for Cryogenic Use," International Scholarly Research Network, ISRN Materials Science, vol. 2011, Article ID 718761, May 25, 2011, 10 pages.

Final Office Action for U.S. Appl. No. 14/315,765, mailed May 11, 2015, 17 pages.

Non-Final Office Action for U.S. Appl. No. 14/260,909, mailed Mar. 20, 2015, 20 pages.

Notice of Allowance for U.S. Appl. No. 14/261,029, mailed Apr. 27, 2015, 10 pages.

Anderson, D.R., "Thermal Conductivity of Polymers," Sandia Corporation, Mar. 8 1966, pp. 677-690.

Author Unknown, "Electrical Properties of Plastic Materials," Professional Plastics, Oct. 28, 2011, http://www.professionalplastics.com/professionalplastics/ElectricalPropertiesofPlastics.pdf, accessed Dec. 18, 2014, 4 pages.

Author Unknown, "Heat Transfer," Cool Polymers, Inc., 2006, http://www.coolpolymers.com/heattrans.html, 2 pages.

Author Unknown, "Thermal Properties of Plastic Materials," Professional Plastics, Aug. 21, 2010, http://www.professionalplastics.com/professionalplastics/ThermalPropertiesofPlasticMaterials.pdf, accessed Dec. 18, 2014, 4 pages.

Mamunya, Ye.P., et al., "Electrical and Thermal Conductivity of Polymers Filled with Metal Powders," European Polymer Journal, vol. 38, 2002, pp. 1887-1897.

Notice of Allowance for U.S. Appl. No. 13/852,648, mailed Jan. 22, 2015, 8 pages.

Non-Final Office Action for U.S. Appl. No. 14/315,765, mailed Jan. 2, 2015, 6 pages.

Non-Final Office Action for U.S. Appl. No. 14/261,029, mailed Dec. 5, 2014, 15 pages.

Final Office Action for U.S. Appl. No. 13/852,648, mailed Oct. 22, 2015, 20 pages.

Corrected Notice of Allowability for U.S. Appl. No. 14/261,029, mailed Nov. 17, 2015, 5 pages.

Author Unknown, "CoolPoly D5108 Thermally Conductive Polyphenylene Sulfide (PPS)," Cool Polymers, Inc., Aug. 8, 2007, 2 pages.

Author Unknown, "CoolPoly D-Series—Thermally Conductive Dielectric Plastics," Cool Polymers, Retrieved Jun. 24, 2013, http://coolpolymers.com/dseries.asp, 1 page.

Author Unknown, "CoolPoly E3605 Thermally Conductive Polyamide 4,6 (PA 4,6)," Cool Polymers, Inc., Aug. 4, 2007, 1 page, http://www.coolpolymers.com/Files/DS/Datasheet_e3605.pdf.

Author Unknown, "CoolPoly E5101 Thermally Conductive Polyphenylene Sulfide (PPS)," Cool Polymers, Inc., Aug. 27, 2007, 1 page, http://www.coolpolymers.com/Files/DS/Datasheet_e5101.pdf.

Author Unknown, "CoolPoly Selection Tool," Cool Polymers, Inc., 2006, 1 page, http://www.coolpolymers.com/select.asp?Application=Substrates+%26+Electcronic_Packaging.

Author Unknown, "CoolPoly Thermally Conductive Plastics for Dielectric Heat Plates," Cool Polymers, Inc., 2006, 2 pages, http://www.coolpolymers.com/heatplate.asp.

(56) References Cited

OTHER PUBLICATIONS

Author Unknown, "CoolPoly Thermally Conductive Plastics for Substrates and Electronic Packaging," Cool Polymers, Inc., 2005, 1 page.
Author Unknown, "Plastics that Conduct Heat," Plastics Technology Online, Jun. 2001, Retrieved Jun. 24, 2013, http://www.ptonline.com/articles/plastics-that-conduct-heat, 4 pages.
Author Unknown, "Sapphire Substrate," from CRC Handbook of Chemistry and Physics, Date Unknown, 1 page.
Author Unknown, "Thermal Properties of Solids," PowerPoint Presentation, No Date, 28 slides, http://www.phys.huji.ac.il/Phys_Hug/Lectures/77602/PHONONS_2_thermal.pdf.
Author Unknown, "Thermal Resistance & Thermal Conductance," C-Therm Technologies Ltd., accessed Sep. 19, 2013, 3 pages, http://www.ctherm.com/products/tci_thermal_conductivity/helpful_links_tools/thermal_resistance_thermal_conductance/.
Author Unknown, "CoolPoly D5506 Thermally Conductive Liquid Crystalline Polymer (LCP)," Cool Polymers, Inc., Dec. 12, 2013, 2 pages.
Beck, D., et al., "CMOS on FZ-High Resistivity Substrate for Monolithic Integration of SiGe-RF-Circuitry and Readout Electronics," IEEE Transactions on Electron Devices, vol. 44, No. 7, Jul. 1997, pp. 1091-1101.
Botula, A., et al., "A Thin-Film SOI 180nm CMOS RF Switch Technology," IEEE Topical Meeting on Silicon Monolithic Integrated Circuits in RF Systems, (SiRF '09), Jan. 2009, pp. 1-4.
Carroll, M., et al., "High-Resistivity SOI CMOS Cellular Antenna Switches," Annual IEEE Compound Semiconductor Integrated Circuit Symposium, (CISC 2009), Oct. 2009, pp. 1-4.
Colinge, J.P., et al., "A Low-Voltage, Low-Power Microwave SOI MOSFET," Proceedings of 1996 IEEE International SOI Conference, Oct. 1996, pp. 128-129.
Costa, J., "RFCMOS SOI Technology for 4G Reconfigurable RF Solutions," Session WEC1-2, Proceedings of the 2013 IEEE International Microwave Symposium, 4 pages.
Huang, Xingyi, et al., "A Review of Dielectric Polymer Composites with High Thermal Conductivity," IEEE Electrical Insulation Magazine, vol. 27, No. 4, Jul./Aug. 2011, pp. 8-16.
Jung, Boo Yang, et al., "Study of FCMBGA with Low CTE Core Substrate," 2009 Electronic Components and Technology Conference, May 2009, pp. 301-304.
Kerr, D.C., et al., "Identification of RF Harmonic Distortion on Si Substrates and Its Reduction Using a Trap-Rich Layer," IEEE Topical Meeting on Silicon Monolithic Integrated Circuits in RF Systems, (SiRF 2008), Jan. 2008, pp. 151-154.
Lederer, D., et al., "New Substrate Passivation Method Dedicated to HR SOI Wafer Fabrication with Increased Substrate Resistivity," IEEE Electron Device Letters, vol. 26, No. 11, Nov. 2005, pp. 805-807.
Lee, Tzung-Yin, et al., "Modeling of SOI FET for RF Switch Applications," IEEE Radio Frequency Integrated Circuits Symposium, May 23-25, 2010, Anaheim, CA, IEEE, pp. 479-482.
Lu, J.Q., et al., "Evaluation Procedures for Wafer Bonding and Thinning of Interconnect Test Structures for 3D ICs," Proceedings of the IEEE 2003 International Interconnet Technology Conference, Jun. 2-4, 2003, pp. 74-76.
Niklaus, F., et al., "Adhesive Wafer Bonding," Journal of Applied Physics, vol. 99, No. 3, 031101 (2006), 28 pages.
Parthasarathy, S., et al., "RF SOI Switch FET Design and Modeling Tradeoffs for GSM Applications," 2010 23rd International Conference on VLSI Design, (VLSID '10), Jan. 2010, pp. 194-199.
Raskin, J.P., et al., "Coupling Effects in High-Resistivity SIMOX Substrates for VHF and Microwave Applications," Proceedings of 1995 IEEE International SOI Conference, Oct. 1995, pp. 62-63.
Rong, B., et al., "Surface-Passivated High-Resistivity Silicon Substrates for RFICs," IEEE Electron Device Letters, vol. 25, No. 4, Apr. 2004, pp. 176-178.
Tombak, A., et al., "High-Efficiency Cellular Power Amplifiers Based on a Modified LDMOS Process on Bulk Silicon and Silicon-On-Insulator Substrates with Integrated Power Management Circuitry," IEEE Transactions on Microwave Theory and Techniques, vol. 60, No. 6, Jun. 2012, pp. 1862-1869.
Non-Final Office Action for U.S. Appl. No. 13/852,648, mailed Jul. 18, 2013, 20 pages.
Final Office Action for U.S. Appl. No. 13/852,648, mailed Nov. 26, 2013, 21 pages.
Applicant-Initiated Interview Summary for U.S. Appl. No. 13/852,648, mailed Jan. 27, 2014, 3 pages.
Advisory Action for U.S. Appl. No. 13/852,648, mailed Mar. 7, 2014, 4 pages.
Notice of Allowance for U.S. Appl. No. 13/852,648, mailed Jun. 16, 2014, 9 pages.
Notice of Allowance for U.S. Appl. No. 13/852,648, mailed Sep. 26, 2014, 8 pages.
Author Unknown, "CoolPoly E2 Thermally Conductive Liquid Crystalline Polymer (LCP)," Cool Polymers, Inc., Aug. 8, 2007, http://www.coolpolymers.com/Files/DS/Datasheet_e2.pdf, 1 page.
Advisory Action for U.S. Appl. No. 14/315,765, mailed Jul. 22, 2015, 3 pages.
Final Office Action for U.S. Appl. No. 14/260,909, mailed Aug. 12, 2015, 18 pages.
Non-Final Office Action for U.S. Appl. No. 13/852,648, mailed Jun. 24, 2015, 20 pages.
Non-Final Office Action for U.S. Appl. No. 13/852,648, mailed Feb. 19, 2016, 12 pages.
Non-Final Office Action for U.S. Appl. No. 14/715,830, mailed Apr. 13, 2016, 16 pages.
Finnne, R. M. et al., "A Water-Amine-Complexing Agent System for Etching Silicon," Journal of the Electrochemical Society, vol. 114, No. 9, Sep. 1967, pp. 965-970.
Extended European Search Report for European Patent Application No. 15184861.1, mailed Jan. 25, 2016, 6 pages.
Non-Final Office Action for U.S. Appl. No. 12/906,689, mailed May 27, 2011, 13 pages.
Non-Final Office Action for U.S. Appl. No. 12/906,689, mailed Nov. 4, 2011, 20 pages.
Search Report for Japanese Patent Application No. 2011-229152, created on Feb. 22, 2013, 58 pages.
Office Action for Japanese Patent Application No. 2011-229152, drafted May 10, 2013, 7 pages.
Final Rejection for Japanese Patent Application No. 2011-229152, drafted Oct. 25, 2013, 2 pages.
Costa, J. et al., "Silicon RFCMOS SOI Technology with Above-IC MEMS Integration for Front End Wireless Applications," Bipolar/BiCMOS Circuits and Technology Meeting, 2008, BCTM 2008, IEEE, pp. 204-207.
Esfeh, Babak Kazemi et al., "RF Non-Linearities from Si-Based Substrates," 2014 International Workshop on Integrated Nonlinear Microwave and Millimetre-wave Circuits (INMMiC), Apr. 2-4, 2014, IEEE, 3 pages.
Joshi, V. et al., "MEMS Solutions in RF Applications," 2013 IEEE SOI-3D-Subthreshold Microelectronics Technology Unified Conference (S3S), Oct. 2013, IEEE, 2 pages.
Morris, Art, "Monolithic Integration of RF-MEMS within CMOS," 2015 International Symposium on VLSI Technology, Systems and Application (VLSI-TSA), Apr. 27-29, 2015, IEEE, 2 pages.
Office Action of the Intellectual Property Office for Taiwanese Patent Application No. 104130224, mailed Jun. 15, 2016, 9 pages.
Final Office Action for U.S. Appl. No. 13/852,648, mailed Jul. 20, 2016, 14 pages.
Final Office Action for U.S. Appl. No. 14/715,830, mailed Sep. 6, 2016, 13 pages.
Non-Final Office Action for U.S. Appl. No. 14/851,652, mailed Oct. 7, 2016, 10 pages.
Notice of Allowance for U.S. Appl. No. 14/959,129, mailed Oct. 11, 2016, 8 pages.
International Search Report and Written Opinion for PCT/US2016/045809, mailed Oct. 7, 2016, 11 pages.

* cited by examiner

Cool Polymers®
CoolPoly® D5506 THERMALLY CONDUCTIVE LIQUID CRYSTALLINE POLYMER (LCP)
CoolPoly D series of thermally conductive plastics transfers heat, a characteristic previously unavailable in injection molding grade polymers. CoolPoly is lightweight, netshape moldable and allows design freedom in applications previously restricted to metals. The D series is electrically non-conductive and can be used for its dielectric properties.

| THERMAL | SI/METRIC |
|---|---|
| THERMAL CONDUCTIVITY | 10 W/mK |
| THERMAL DIFFUSIVITY | 0.05 cm$^2$/sec |
| SPECIFIC HEAT | 1.0 J/g°C |
| COEFFICIENT OF LINEAR THERMAL EXPANSION | |
|    PARALLEL | 6.2 ppm/°C |
|    NORMAL | 5.6 ppm/°C |
| TEMPERATURE OF DEFLECTION | |
|    @ 0.45 MPa | >300 °C |
|    @ 1.80 MPa | 263 °C |
| FLAMMABILITY | V0 @ 1.0 mm |
| MECHANICAL | SI/METRIC |
| TENSILE MODULUS | 10900 MPa |
| TENSILE STRENGTH | 50 MPa |
| NOMINAL STRAIN @ BREAK | 0.7 % |
| FLEXURAL STRENGTH | 84 MPa |
| FLEXURAL MODULUS | 12300 MPa |
| IMPACT STRENGTH | |
|    CHARPY UNNOTCHED | 6.0 kJ/m$^2$ |
|    CHARPY NOTCHED | 3.2 kJ/m$^2$ |
| ELECTRICAL | SI/METRIC |
| SURFACE RESISTIVITY | 2.0E14 OHM/SQUARE |
| VOLUME RESISTIVITY | 1.6E14 OHM-CM |
| PHYSICAL | SI/METRIC |
| DENSITY | 1.80 g/cc |
| MOLD SHRINKAGE | |
|    FLOW | 0.1 % |
|    CROSS-FLOW | 0.3 % |

SILICON-ON-PLASTIC SEMICONDUCTOR DEVICE AND METHOD OF MAKING THE SAME

RELATED APPLICATIONS

The present application claims priority to U.S. provisional patent application No. 61/898,009, filed Oct. 31, 2013.

The present application is related to co-pending U.S. patent application Ser. No. 13/852,648, filed Mar. 28, 2013, entitled "SEMICONDUCTOR DEVICE WITH A POLYMER SUBSTRATE AND METHODS OF MANUFACTURING THE SAME," which claims priority to U.S. provisional application No. 61/773,490, filed Mar. 6, 2013.

The present application is related to co-pending U.S. patent application Ser. No. 14/315,765, filed Jun. 26, 2014, entitled "SEMICONDUCTOR DEVICE WITH A POLYMER SUBSTRATE AND METHODS OF MANUFACTURING THE SAME," which is a continuation of U.S. patent application Ser. No. 13/852,648, filed Mar. 28, 2013, which claims priority to U.S. provisional application No. 61/773,490, filed Mar. 6, 2013.

The present application is related to co-pending U.S. patent application Ser. No. 14/260,909, filed Apr. 24, 2014, entitled "SILICON-ON-DUAL PLASTIC (SODP) TECHNOLOGY AND METHODS OF MANUFACTURING THE SAME," which claims priority to U.S. provisional application No. 61/815,327, filed Apr. 24, 2013, and U.S. provisional application No. 61/816,207, filed Apr. 26, 2013. U.S. patent application Ser. No. 14/260,909, is a continuation-in-part of U.S. patent application Ser. No. 13/852,648, filed Mar. 28, 2013, which claims priority to U.S. provisional application No. 61/773,490, filed Mar. 6, 2013.

The present application is related to co-pending U.S. patent application Ser. No. 14/261,029, filed Apr. 24, 2014, entitled "PATTERNED SILICON-ON-PLASTIC (SOP) TECHNOLOGY AND METHODS OF MANUFACTURING THE SAME," now U.S. Pat. No. 9,214,337, which claims priority to U.S. provisional application No. 61/815,327, filed Apr. 24, 2013, and U.S. provisional application No. 61/816,207, filed Apr. 26, 2013. U.S. patent application Ser. No. 14/261,029 is a continuation-in-part of U.S. patent application Ser. No. 13/852,648, filed Mar. 28, 2013, which claims priority to U.S. provisional application No. 61/773,490, filed Mar. 6, 2013.

All of the applications listed above are hereby incorporated herein by reference in their entireties.

FIELD OF THE DISCLOSURE

This disclosure relates to semiconductor devices and methods for manufacturing the same.

BACKGROUND

Radio frequency complementary metal oxide (RFCMOS) silicon-on-insulator (SOI) RF power switches are devices that are essential for practically every mobile handset currently on the market. Existing RFCMOS SOI technologies used to manufacture these devices provide excellent performance in increasingly complex multi-throw RF switches, tunable RF capacitance arrays, and antenna RF tuners. Conventional RFCMOS SOI technologies are built on high resistivity CMOS wafer handles that have resistivities ranging from 1000 Ohm-cm to 5000 Ohm-cm. A power switch employing RFCMOS SOI technology uses a high resistivity wafer handle so that a plurality of relatively low voltage field effect transistors (FETs) can be stacked while maintaining a desired isolation between the low voltage FETs.

In an RF switch application for third generation (3G) and fourth generation (4G) wireless applications, a high degree of RF device linearity and a relatively very low level of RF intermodulation under RF power conditions are crucial. Therefore, inherent nonlinearities in RF devices such as CMOS n-type field effect transistor (NFET) devices must be mitigated. Another source of nonlinearities is attributed to a high resistivity silicon wafer handle region interfaced with a buried oxide (BOX) dielectric region. One proposed solution for mitigating these nonlinearities includes a trap rich silicon/oxide interface that degrades carrier lifetimes in the silicon/oxide interface. Other proposed solutions for mitigating the nonlinearities due to the high resistivity silicon wafer handle region interfaced with the BOX dielectric region include harmonic suppression process techniques that include a series of process steps and heating treatments to minimize nonlinearities attributed to the high resistivity handle region interfaced with the BOX dielectric region. However, all the aforementioned proposed solutions add significant complexity and cost to CMOS SOI technology. What is needed are CMOS SOI-based semiconductor devices and methods for manufacturing CMOS SOI devices that do not produce the nonlinearities attributed to the high resistivity silicon wafer handle region interfaced with the BOX dielectric region.

SUMMARY

A semiconductor device that does not produce nonlinearities attributed to a high resistivity silicon handle interfaced with a dielectric region of a buried oxide (BOX) layer is disclosed. The semiconductor device includes a semiconductor stack structure with a first surface and a second surface wherein the second surface is on an opposite side of the semiconductor stack structure from the first surface. At least one device terminal is included in the semiconductor stack structure and at least one electrical contact extends from the second surface and is electrically coupled to the at least one device terminal. The semiconductor stack is protected by a polymeric layer disposed on the first surface of the semiconductor stack. The polymeric layer has high thermal conductivity and high electrical resistivity.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

FIG. 7 is a specification table that lists thermal, mechanical, electrical, and physical specifications for an exemplary polymer material that is usable to form the polymeric layer of the semiconductor device of the present disclosure.

DETAILED DESCRIPTION

Figure 1:
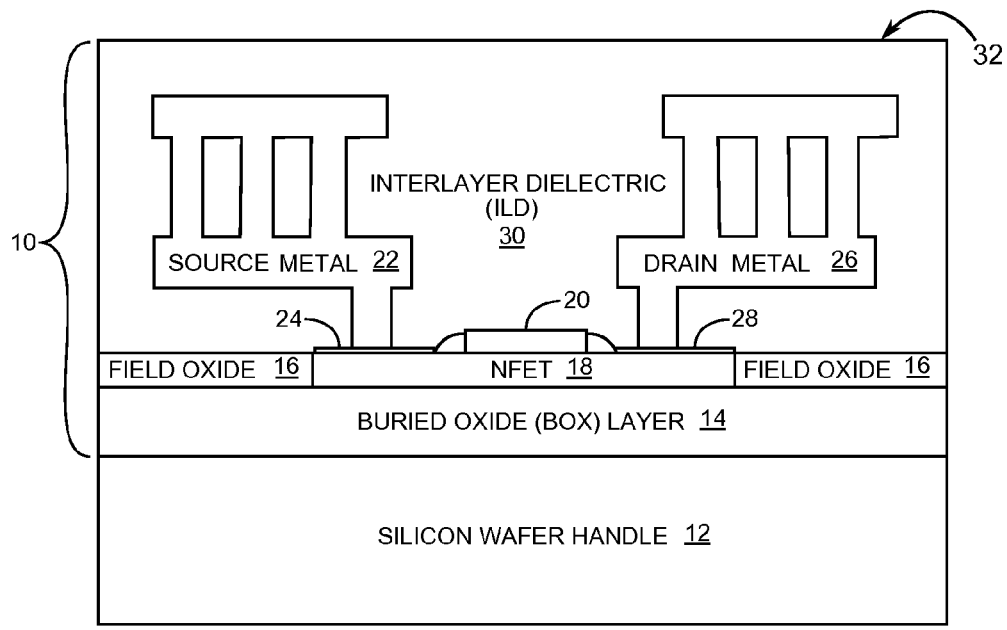
FIG. 1 is a cross-sectional diagram of a semiconductor stack structure interfaced with a relatively low resistivity silicon wafer handle.

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that when an element such as a layer, region, or substrate is referred to as being "over," "on," "disposed on," "in," or extending "onto" another element, it can be directly over, directly on, directly disposed on, directly in, or extend directly onto the other element or intervening elements may also be present. In contrast, when an element is referred to as being "directly over," "directly on," "directly disposed on," "directly in," or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures. Moreover, the phrase "electrically resistive" used herein means having a resistance greater than $10^6$ Ohm-cm. Also, the phrase "thermally conductive" used herein means having a thermal conductivity greater than 2 watts per meter Kelvin (W/mK).

Traditional RFCMOS SOI technologies have reached a fundamental barrier due to limitations inherent to silicon wafer handles that prevent the relatively better insulating characteristics available in group IV, group III-V, or sapphire wafer handles. The disclosed semiconductor device replaces the silicon wafer handle with a polymeric layer. As such, the semiconductor device of this disclosure eliminates the need for a high resistivity silicon wafer handle in a provided semiconductor stack structure.

Advanced silicon wafer handles for RF switch applications have resistivities that range from 1000 Ohm-cm to 5000 Ohm-cm and are significantly more costly than standard silicon wafer handles having much lower resistivities. Moreover, relatively complex process controls are needed to realize high resistivity in advanced silicon wafer handles. For these reasons, standard silicon wafer handles are used ubiquitously in standard SOI technologies. However, standard silicon wafer handles with their much lower resistivities are not conducive for stacking a plurality of relatively low voltage field effect transistors (FETs) while maintaining a desired isolation between the low voltage FETs. Fortunately, the polymeric layer of the present disclosure indirectly replaces the silicon wafer handle and thus eliminates the problems associated with both high and low resistivity silicon wafer handles.

Additionally, the methods of the present disclosure allow for an immediate migration to 300 mm wafer handles for use in RF power switch applications. This is an important development since there is currently no commercially viable high volume supply of high resistivity RFSOI wafer handles in the 300 mm wafer diameter format. Fabricating the present semiconductor devices on 300 mm diameter wafer handles would provide a significant improvement in die costs. Moreover, the need for a trap rich layer and/or harmonic suppression techniques is eliminated, thereby resulting in a significantly simpler process flow and lower cost.

Further still, the polymeric layer is expected to eliminate RF nonlinear effects resulting from the interface between the BOX layer and the silicon wafer handle used in traditional semiconductor processes to manufacture RF switch devices. The present methods realize RF switch devices that have linear characteristics relatively close to ideal linear characteristics.

Additionally, the semiconductor device of this disclosure offers a near ideal voltage stacking of NFET transistors. Traditionally, the number of NFET devices that can be stacked is limited by silicon wafer handle resistivity combined with the interface effects between the BOX layer and the silicon wafer handle. This issue essentially limits the number of practical NFET transistors that can be stacked and thus limits the highest RF operating voltage for the resulting NFET transistor stack. Replacing silicon wafer handles with the polymeric layer of the present disclosure allows relatively many more NFET transistors to be practically ideally stacked. The resulting semiconductor device is operable at relatively much higher RF power levels and RMS voltages than is traditionally allowable on silicon wafer handle technologies.

Furthermore, the highest RF frequency of operation of RF power switches built with the disclosed polymeric layer can be extended beyond the highest frequency of operation achievable with traditional RFCMOS SOI technologies. Typically, a silicon wafer handle resistivity is in the range of 1000-3000 Ohm-cm, which effectively imposes an operational high frequency limit. The resulting resistivity of the polymeric layer of the semiconductor device taught in this disclosure is several orders of magnitude higher than what is achieved in high resistivity silicon. For instance, there are polymers with nearly ideal electrically insulating characteristics, with resistivity values similar to what is obtained in gallium arsenide (GaAs) and sapphire semi-insulating wafer handles.

FIG. 1 is a cross-sectional diagram of a semiconductor stack structure 10 interfaced with a relatively low resistivity silicon wafer handle 12. In the exemplary case of FIG. 1, the semiconductor stack structure 10 includes a buried oxide (BOX) layer 14, a field oxide layer 16, and an NFET device layer 18, with a gate 20. A device terminal in the form of a source metal 22 is coupled to a source contact 24. Similarly, another device terminal in the form of a drain metal conductor 26 is coupled to a drain contact 28. An interlayer dielectric (ILD) 30 protects the gate 20. The ILD 30 has an ILD surface 32.

Figure 2:
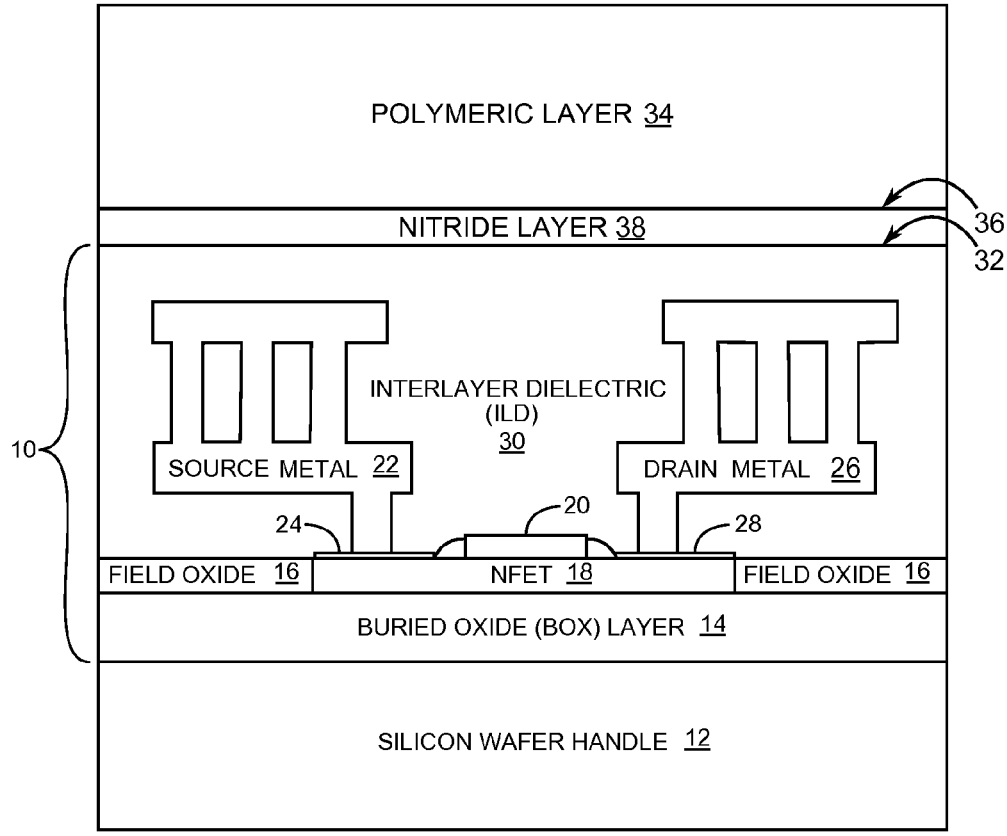
FIG. 2 is a cross-sectional diagram of the semiconductor stack structure after a polymeric layer has been disposed on a first surface of the semiconductor stack structure.

FIG. 2 is a cross-sectional diagram of the semiconductor stack structure 10 after a polymeric layer 34 has been disposed on a first surface 36 of the semiconductor stack structure 10. The first surface 36 can be the same as the ILD surface 32 if there are no intervening layers, or the first surface 36 can be an exterior surface of an optional nitride layer 38 disposed onto the ILD surface 32. The nitride layer 38 can be a silicon nitride layer. There are two distinct methods described in this disclosure for creating the polymeric layer 34: 1) the polymeric layer 34 may be directly molded to the nitride layer 38 by techniques such as compression molding or injection molding; and 2) a pre-fabricated polymeric sheet may be attached to the nitride layer 38, thereby making up the polymeric layer 34, by a number of bonding techniques such as plasma bonding or adhesive bonding. When the pre-fabricated polymeric layer 34 is bonded to the nitride layer 38 rather than molded, it is therefore imperative that both surfaces be exceptionally planar. The first surface 36 is relatively exceptionally planer, having a roughness range of 0.1 nanometers root mean square (RMS) to 2 nanometers RMS; areas with higher surface roughness RMS values will not come in contact during bonding, potentially leading to a gap between the two surfaces.

The polymer material making up the polymeric layer 34 has a unique set of characteristics in that the polymer material is both a relatively excellent electrical insulator and a relatively excellent heat conductor. Typical polymer materials making up common plastic parts are extremely poor conductors of heat. Poor heat conduction is a common characteristic of plastics normally used in an over-mold operation. However, there are engineered polymer materials that do provide relatively excellent heat conduction. Various formulations for such polymers yield thermal conductivities that range from greater than 2 Watts per meter Kelvin (W/mK) to around about 50 W/mK. In one embodiment, the thermal conductivity of the polymer ranges from around about 50 W/mK to around about 500 W/mK. Future enhancements in polymer science may provide additional improvements in terms of thermal conductivity while maintaining nearly ideal electrical insulating characteristics in the polymer. For example, carbon nanostructures can be used as admixture to the polymer material making up the polymeric layer 34 to enhance thermal conductivity. Types of carbon nanostructures include carbon nanotubes, fullerenes, nanodiamonds, and graphene along with combinations thereof. Heat dissipation during operation of the semiconductor stack 10 benefits from the maximization of the polymer thermal conductivity and it should be understood that an upper bound of polymer thermal conductivity nears a theoretical thermal conductivity of carbon nanotubes and graphene, which is 6600 W/mK.

It is to be understood that a temporary carrier (not shown) can be mounted to the polymeric layer 34 to improve handling of the semiconductor stack structure 10 during processing. The temporary carrier would typically be a silicon wafer, but could be made of other materials that provide the semiconductor stack structure 10 with rigidity appropriate for processing. The temporary carrier would be removed at a later stage of processing. However, in some instances, the temporary carrier need not be removed. Such a case would be for applications in which the temporary carrier is left attached to the polymeric layer 34. This case would apply whether the temporary carrier is thinned or not thinned.

Figure 3:
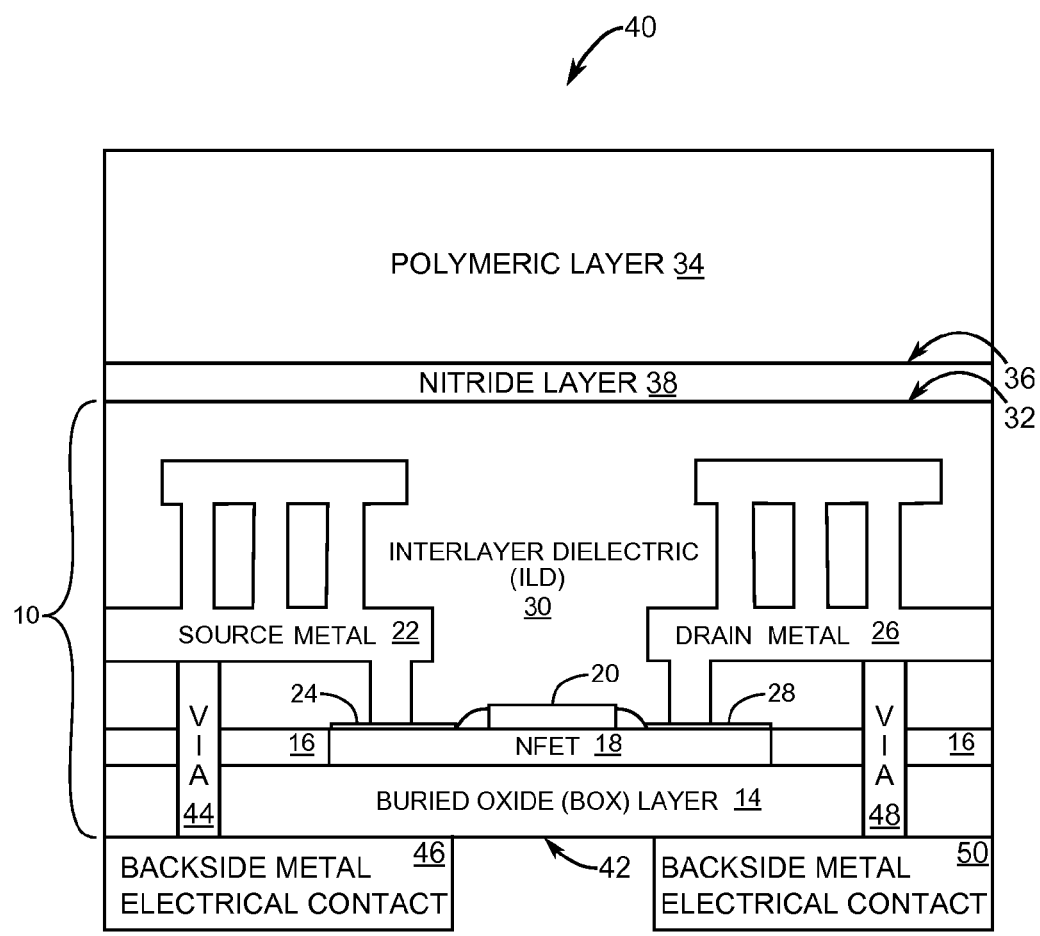
FIG. 3 is a cross-sectional diagram of a semiconductor device with backside contacts that in accordance with the present disclosure includes a polymeric layer disposed on a first surface of the semiconductor stack that is opposed to a second surface formed by a removal of the relatively low resistivity silicon wafer handle.

FIG. 3 is a cross-sectional diagram of a semiconductor device 40 that in accordance with the present disclosure does not include the silicon wafer handle 12 (FIGS. 1 and 2). Instead, the semiconductor device 40 has a second surface 42 that is exposed after the silicon wafer handle 12 is removed using traditional techniques that are discussed later in this disclosure. A first electrically conductive via 44 extends through the second surface 42, the box layer 14, the field oxide layer 16, and a portion of the ILD 30 to contact the source metal 22. In this exemplary case, the second surface 42 is typically referred to as a backside.

A first electrical contact 46 is disposed on the second surface 42 to be in electrical contact with the first electrically conductive via 44. A second electrically conductive via 48 extends through the second surface 42, the box layer 14, the field oxide layer 16, and a portion of the ILD 30 to contact the drain metal 26. A second electrical contact 50 is disposed on the second surface 42 to be in electrical contact with the second electrically conductive via 48. In this exemplary case, the first electrical contact 46 and the second electrical contact 50 are made of metal. In particular, the first electrical contact 46 and the second electrical contact 50 are typically made of the metal that is typically referred to as backside metal in the semiconductor industry. However, it is to be understood that other suitable conductive materials such as polysilicon are also available for forming the first electrical contact 46 and the second electrical contact 50. It is to be understood that at this point in a process, a wafer containing a plurality of the semiconductor stack structure 10 could have been diced and the polymeric layer 34 can be or would be attached to a module (not shown). As such, conventional wire bonds could be used to connect the first electrical contact 46 and the second electrical contact 50 on the module to provide appropriate external connections.

Figure 4:
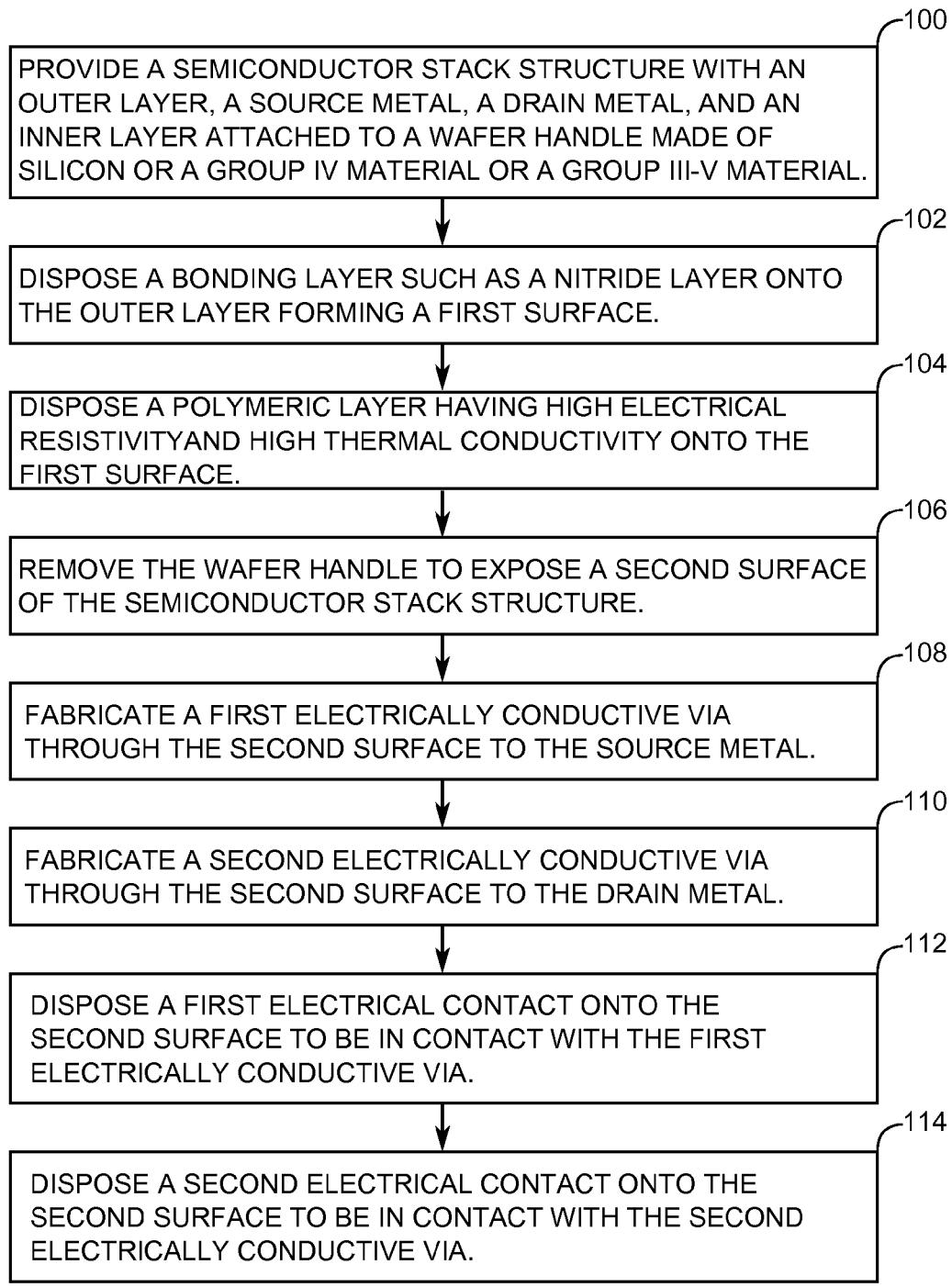
FIG. 4 is a process diagram of an exemplary process that yields the semiconductor device of FIG. 3.

FIG. 4 is a process diagram of an exemplary process that yields the semiconductor device 40. The process begins with providing a semiconductor structure such as semiconductor stack structure 10 with an outer layer such as ILD 30, a source metal such as the source metal 22, a drain metal such as the drain metal 26, and an inner layer such as the BOX layer 14, which is attached to a wafer handle such as silicon wafer handle 12 (step 100). The wafer handle can be made of silicon or a group IV material or a group III-V material. Next, a bonding layer such as nitride layer 38 is disposed onto the outer layer forming a first surface such as first surface 36 (step 102). The nitride layer 38 can be a silicon nitride layer that may be deposited as an example via a plasma-enhanced chemical vapor deposition (PECVD) system by the decomposition of silane and nitrogen gases, as commonly known to those skilled in the art. Such PECVD systems operate at temperatures typically between room temperature and 350° C. The nitride layer 38 may also be deposited by other techniques including liquid phase chemical vapor deposition (LPCVD) and sputtered from a nitride target using RF sputtering. The nitride layer 38 does not significantly impact the thermal conductivity throughout the semiconductor device 40. In one embodiment, the thickness of the nitride layer 38 ranges from around about 100 Å to around about 1000 Å. In another embodiment, the thickness of the nitride layer 38 ranges from around about 1000 Å to around about 5000 Å. In yet another embodiment, the thickness of the nitride layer 38 ranges from around about 5000 Å to around about 10,000 Å.

Next, a polymeric layer such as polymeric layer 34 is disposed onto the nitride layer, which in this exemplary embodiment is a first surface (step 104). The polymer material making up the polymeric layer 34 should also be a good electrical insulator. A desirable thickness for the polymeric layer 34 ranges from around about 100 µm to around about 500 µm, but other desirable thicknesses for the polymeric layer 34 can be thinner or thicker depending on the characteristics of the polymer material used to make up the polymeric layer 34. In general, the electrical resistivity of the polymeric layer 34 should be greater than $10^6$ Ohm-cm. In at least one embodiment, the polymeric layer 34 has a relatively high electrical resistivity that ranges from around about $10^{12}$ Ohm-cm to around about $10^{16}$ Ohm-cm. In combination with relatively high electrical resistivity, the thermal conductivity of the polymeric layer 34 is on the order of the thermal conductivity of typical semiconductors, which is typically greater than 2 W/mK. In one embodiment, the thermal conductivity of the polymeric layer 34 ranges from greater than 2 W/mK to around about 10 W/mK. In yet another embodiment, the thermal conductivity of the polymeric layer 34 ranges from around about 10 W/mK to around about 50 W/mK. As polymer science provides materials with additional thermal conductivities, these materials can be utilized in the semiconductor device of this disclosure. As stated above, the semiconductor device of this disclosure benefits from the maximization of the polymer thermal conductivity and it should be understood that an upper bound of polymer thermal conductivity nears a theoretical thermal conductivity of carbon nanotubes and graphene, which is 6600 W/mK. In one embodiment the polymeric layer 34 has a thermal conductivity of at least 2 W/mK and an electrical resistivity of at least $10^6$ Ohm-cm disposed on the first surface 36 of the semiconductor stack structure 10.

It is to be understood that the polymeric layer 34 can then be disposed on the first surface 36 using various polymer material disposing methods. Such methods for attaching the polymeric layer 34 to the nitride layer 38 of the semiconductor stack structure 10 include, but are not limited to, injection molding, spin deposition, spray deposition, and pattern dispensing of polymer material directly onto the first surface 36.

At this point, the silicon wafer handle 12 is removed to expose a second surface of the semiconductor stack structure 10, which will typically be an etched surface of the box layer 14 (step 106). Once the semiconductor stack structure 10 is protected by the polymeric layer 34, the silicon wafer handle 12 may be removed by a number of different techniques. One technique uses a conventional grind operation that removes a majority of the silicon wafer handle 12 followed by a selective wet or dry etch step of the remaining silicon wafer handle 12, and selectively stopping at a second surface 42 of the semiconductor stack structure 10. In this exemplary case, the second surface 42 is also the exposed surface of the BOX layer 14. Other techniques for removal of the silicon wafer handle 12 exist and are well documented in the literature. Some of these other techniques are based on dry or wet etch processes. The process used to remove the silicon wafer handle 12 is not particularly relevant to the present disclosure. However, it is desirable for the removal of the silicon wafer handle 12 to be accomplished without damaging the BOX layer 14 and the remainder of the semiconductor stack structure 10 as well as the polymeric layer 34.

Next, the first electrically conductive via 44 is fabricated through the second surface 42 to the source metal 22 (step 108). The second electrically conductive via 48 is fabricated through the second surface 42 to the drain metal 26 (step 110). It is to be understood that the first electrically conductive via 44 and the second electrically conductive via 48 are typically fabricated simultaneously using known semiconductor via fabrication techniques.

Once the first electrically conductive via 44 and second electrically conductive via 48 are fabricated, the first electrical contact 46 is disposed onto the second surface 42 to be in contact with the first electrically conductive via 44 (step 112). Likewise, the second electrical contact 50 is disposed onto the second surface 42 to be in contact with the second electrically conductive via 48 (step 114). It is to be understood that the first electrical contact 46 and the second electrical contact 50 are typically fabricated simultaneously using known semiconductor contact fabrication techniques.

Figure 5:
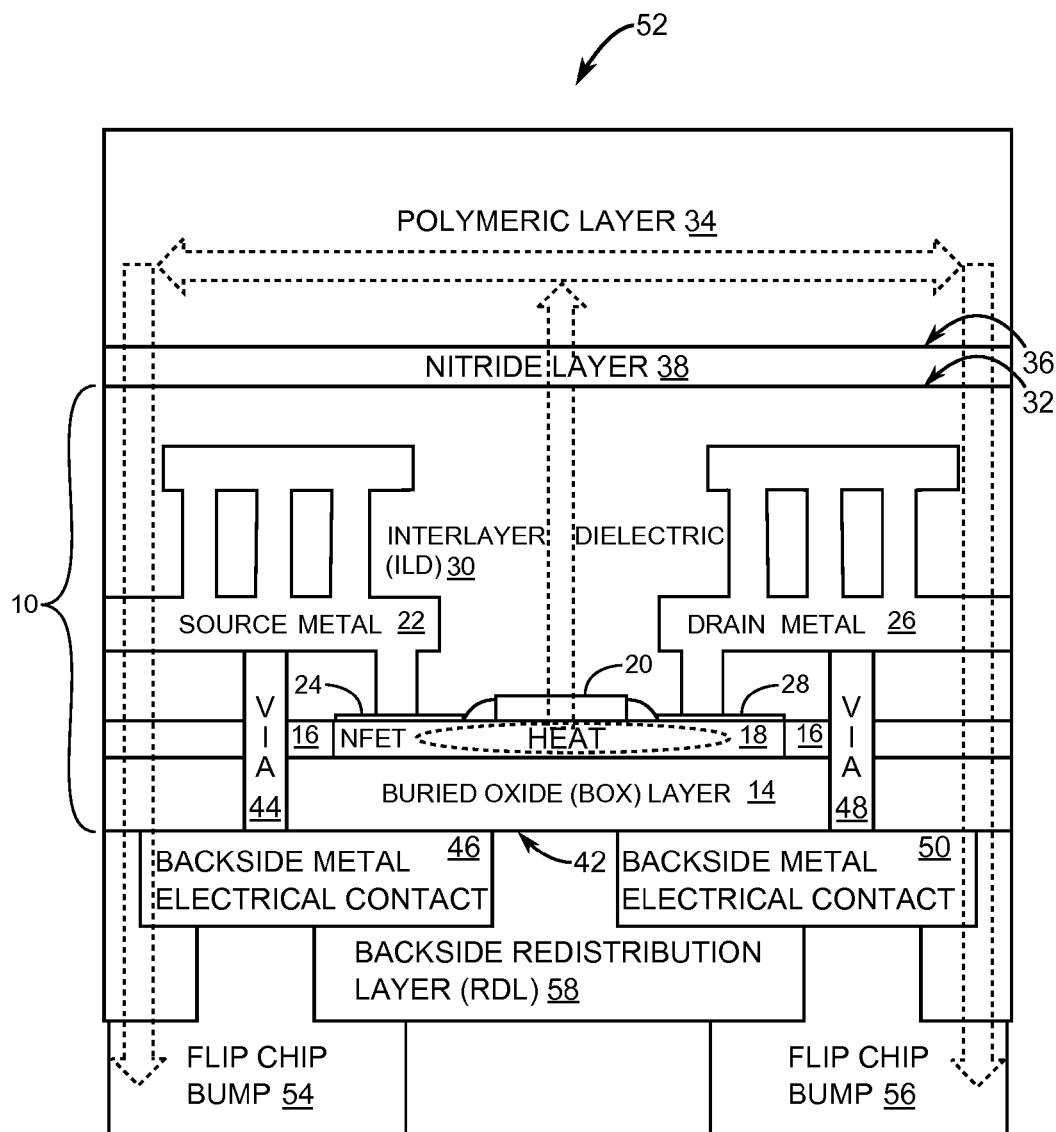
FIG. 5 is a cross-sectional diagram of a semiconductor device with flip-chip bumps that in accordance with the present disclosure includes a polymeric layer disposed on a first surface of the semiconductor stack that is opposed to a second surface formed by a removal of the relatively low resistivity silicon wafer handle.

FIG. 5 is a cross-sectional diagram of a semiconductor device 52 with a first flip chip bump 54 and a second flip chip bump 56 that in accordance with the present disclosure includes the polymer disposed on the first surface 36 of the semiconductor stack that is opposed to the second surface 42 formed by a removal of the relatively low resistivity silicon wafer handle 12 (FIG. 1). In some embodiments the semiconductor device 52 can also include a backside redistribution layer (RDL) 58 for re-routing signal flows for customized applications. The RDL 58 is typically disposed on one or more unoccupied portions of the second surface 42.

FIG. 5 also shows heat flow paths through the semiconductor device 52 with the polymeric layer 34 after the semiconductor device 52 has reached a steady state powered condition. Under normal operation, heat is generated by energy losses in the NFET device layer 18. An origin for the heat generated is represented by a dashed oval in the NFET device layer 18 adjacent to the BOX layer 14. The flow of heat is represented by dashed arrows. As usual for high performance RF applications, the semiconductor device 52 is flip chip mounted in its final application. As such, the heat to be extracted is transferred by thermal conduction to the first flip chip bump 54 and the second flip chip bump 56. Thermal analysis of typical SOI technologies indicates that unless the silicon wafer handle 12 (FIG. 1) is replaced with a good thermal conductive material, the NFET device layer 18 quickly overheats under nominal conditions and essentially becomes very unreliable and likely fails. Under normal conditions and design rules, back-end-of-line metallization layers (not shown) provide too high a thermal resistance path to be used effectively as a means to dissipate the heat generated by the device. The polymeric layer 34 accomplishes effectively the same function as the original silicon wafer handle 12 from a thermal management point of view while also providing much improved linear characteristics and effectively much higher electrical resistivity than the 1 kOhm-cm electrical resistivity of the silicon wafer handle 12.

Figure 6:
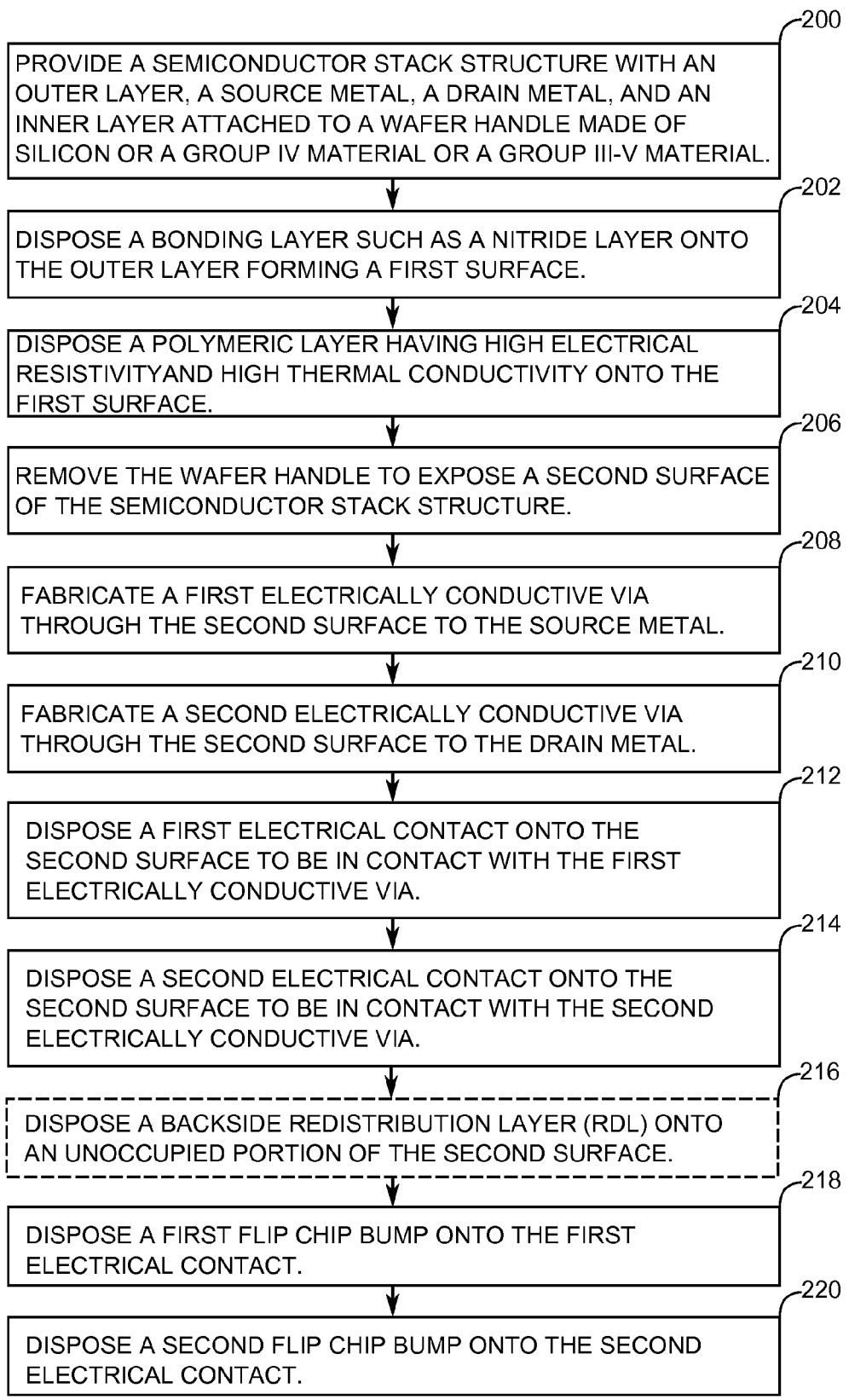
FIG. 6 is a process diagram of an exemplary process that yields the semiconductor device of FIG. 5.

FIG. 6 is a process diagram of an exemplary process that yields the semiconductor device 52. The process begins with providing a semiconductor structure such as semiconductor stack structure 10 with an outer layer such as ILD 30, a source metal such as the source metal 22, a drain metal such as the drain metal 26, and an inner layer such as the BOX layer 14, which is attached to a wafer handle such as silicon wafer handle 12 (step 200). The wafer handle can be made of silicon or a group IV material or a group III-V material. Next, a bonding layer such as nitride layer 38 is disposed onto the outer layer forming a first surface such as first surface 36 (step 202). The nitride layer 38 can be a silicon nitride layer that may be deposited as an example via a plasma-enhanced chemical vapor deposition (PECVD) system by the decomposition of silane and nitrogen gases, as commonly known to those skilled in the art. Such PECVD systems operate at temperatures typically between room temperature and 350° C. The nitride layer 38 may also be deposited by other techniques including liquid phase chemical vapor deposition (LPCVD) and sputtered from a nitride target using RF sputtering. The nitride layer 38 does not significantly impact the thermal conductivity throughout the semiconductor device 52. In one embodiment, the thickness of the nitride layer 38 ranges from around about 100 Å to around about 1000 Å. In another embodiment, the thickness of the nitride layer 38 ranges from around about 1000 Å to around about 5000 Å. In yet another embodiment, the thickness of the nitride layer 38 ranges from around about 5000 Å to around about 10,000 Å.

Next, a polymer such as polymeric layer 34 is disposed onto the nitride layer 38, which in this exemplary embodiment is a first surface (step 204). The polymer material making up the polymeric layer 34 should also be a good electrical insulator. A desirable thickness for the polymeric layer 34 ranges from around about 100 μm to around about 500 μm, but other desirable thicknesses for the polymeric layer 34 can be thinner or thicker depending on the characteristics of the polymer material used to make up the polymeric layer 34. In general, the electrical resistivity of the polymeric layer 34 should be greater than $10^6$ Ohm-cm. In at least one embodiment, the polymeric layer 34 has a relatively high electrical resistivity that ranges from around about $10^{12}$ Ohm-cm to around about $10^{16}$ Ohm-cm. In combination with relatively high electrical resistivity, the thermal conductivity of the polymeric layer 34 is on the order of the thermal conductivity of typical semiconductors, which is typically greater than 2 W/mK. In one embodiment, the thermal conductivity of the polymeric layer 34 ranges from greater than 2 W/mK to around about 10 W/mK. In yet another embodiment, the thermal conductivity of the polymeric layer 34 ranges from around about 10 W/mK to around about 50 W/mK. As polymer science provides materials with additional thermal conductivities, these materials can be utilized in the semiconductor device of this disclosure. As stated above, the semiconductor device of this disclosure benefits from the maximization of the polymer thermal conductivity and it should be understood that an upper bound of polymer thermal conductivity nears a theoretical thermal conductivity of carbon nanotubes and graphene, which is 6600 W/mK.

It is to be understood that the polymeric layer 34 can then be disposed on the first surface 36 using various polymer material disposing methods. Such methods for attaching the polymeric layer 34 to the nitride layer 38 of the semiconductor stack structure 10 include, but are not limited to, injection molding, spin deposition, spray deposition, and pattern dispensing of polymer material directly onto the first surface 36.

At this point, the silicon wafer handle 12 is removed to expose a second surface of the semiconductor stack structure 10, which will typically be an etched surface of the box layer 14 (step 206). Once the semiconductor stack structure 10 is protected by the polymeric layer 34, the silicon wafer handle 12 may be removed by a number of different techniques. One technique uses a conventional grind operation that removes a majority of the silicon wafer handle 12 followed by a selective wet or dry etch step of the remaining silicon wafer handle 12, and selectively stopping at the second surface 42 of the semiconductor stack structure 10. In this exemplary case, the second surface 42 is also the exposed surface of the BOX layer 14. Other techniques for removal of the silicon wafer handle 12 exist and are well documented in the literature. Some of these other techniques are based on dry or wet etch processes. The process used to remove the silicon wafer handle 12 is not particularly relevant to the present disclosure. However, it is desirable for the removal of the silicon wafer handle 12 to be accomplished without damaging the BOX layer 14 and the remainder of the semiconductor stack structure 10 as well as the polymeric layer 34.

Next, the first electrically conductive via 44 is fabricated through the second surface 42 to the source metal 22 (step 208). The second electrically conductive via 48 is fabricated through the second surface 42 to the drain metal 26 (step 210). It is to be understood that the first electrically conductive via 44 and the second electrically conductive via 48 are typically fabricated simultaneously using known semiconductor via fabrication techniques.

Once the first electrically conductive via 44 is fabricated and the second electrically conductive via 48 is fabricated, the first electrical contact 46 is disposed onto the second surface 42 to be in electrical contact with the first electrically conductive via 44 (step 212). Similarly, the second electrical contact 50 is disposed onto the second surface 42 to be in electrical contact with the second electrically conductive via 48 (step 214).

Next, an optional RDL, such as RDL 58 (FIG. 5), can be disposed onto unoccupied portions of the second surface 42 to re-distribute signal flow for customized applications (step 216). FIG. 6 denotes the optional nature of the RDL 58 by highlighting step 216 in a dashed box.

Next, the first flip chip bump 54 is disposed onto the first electrical contact 46 to extend beyond the second surface 42 (step 218). Similarly, the second flip chip bump 56 is disposed onto the second electrical contact 50 to extend beyond the second surface 42 (step 220).

FIG. 7 is a specification table that lists thermal, mechanical, electrical, and physical specifications for an exemplary polymer material that is usable to form the polymeric layer 34 of the semiconductor device 40 (FIG. 3). The exemplary polymer material specified in the specification table of FIG. 6 is made by Cool Polymers® and is sold under the label "CoolPoly® D5506 Thermally Conductive Liquid Crystalline Polymer (LCP)." It is to be understood that the specification table of FIG. 6 only provides exemplary specifications and that a variety of mechanical and physical properties are available within the scope of the present disclosure. Moreover, the quantitative values for the thermal and electrical properties provided in the table of FIG. 6 only represent exemplary values that are within the range of thermal and electrical properties already discussed in the above disclosure. The polymeric layer 34 is a thermoplastic such as polyamides that include nylon. Other suitable thermoplastics include, but are not limited to, Acrylonitrile Butadiene Styrene (ABS), Polyetheretherketone (PEEK) and Polysulfone. In other embodiments, the polymeric layer 34 can be a thermoset plastic such as a two part epoxy resin. Moreover, the polymeric layer 34 typically includes an admixture for increasing thermal conductivity. Examples of suitable thermal conductivity enhancing admixtures include ceramic powders, which include, but are not limited to, boron nitride powder and aluminum nitride powder.

In an exemplary embodiment, the boron nitride powder or aluminum nitride powder can have a concentration ratio that ranges from around about 1% to around about 10% of the polymeric layer 34. In another exemplary embodiment, the boron nitride powder or aluminum nitride powder can have a concentration ratio that ranges from around about 11% to around about 20% of the polymeric layer 34. In yet another exemplary embodiment, the boron nitride powder or aluminum nitride powder can have a concentration ratio that ranges from around about 21% to around about 50% of the polymeric layer 34. In still another exemplary embodiment, the boron nitride powder or aluminum nitride powder can have a concentration ratio that ranges from around about 51% to around about 75% of the polymeric layer 34.

Those skilled in the art will recognize improvements and modifications to the embodiments of the present disclosure. All such improvements and modifications are considered within the scope of the concepts disclosed herein and the claims that follow.

What is claimed is:

1. A semiconductor device comprising:
a semiconductor stack structure including at least one device terminal of a semiconductor device and having a first surface and a second surface, wherein the second surface is an external surface of a buried oxide (BOX) layer that is on an opposite side of the semiconductor stack structure from the first surface;
at least one electrical contact that is electrically coupled to the at least one device terminal and extending outward from the second surface; and
a polymeric layer disposed on the first surface of the semiconductor stack structure and comprises a polymer and an admixture that increases thermal conductivity of the polymer.

2. The semiconductor device of claim 1 wherein the polymeric layer has a thermal conductivity of at least 2 watts per meter Kelvin (W/mK) and an electrical resistivity of at least $10^6$ Ohm-cm.

3. The semiconductor device of claim 1 wherein a thermal conductivity of the polymeric layer ranges from greater than 2 watts per meter Kelvin (W/mK) to around about 50 W/mK.

4. The semiconductor device of claim 1 wherein a thermal conductivity of the polymeric layer ranges from around about 50 W/mK to around about 6600 W/mK.

5. The semiconductor device of claim 1 wherein an electrical resistivity of the polymeric layer ranges from around about $10^6$ Ohm-cm to around about $10^{16}$ Ohm-cm.

6. The semiconductor device of claim 1 wherein the admixture is a ceramic powder.

7. The semiconductor device of claim 6 wherein the ceramic powder is boron nitride powder having a concentration ratio that ranges from around about 1% to around about 75% of the polymeric layer.

8. The semiconductor device of claim 6 wherein the ceramic powder is aluminum nitride powder having a concentration ratio that ranges from around about 1% to around about 75% of the polymeric layer.

9. The semiconductor device of claim 1 wherein the admixture is carbon nano structures.

10. The semiconductor device of claim 1 wherein the polymer comprises a polysulfone compound.

11. The semiconductor device of claim 1 wherein the polymer is a thermoplastic.

12. The semiconductor device of claim 11 wherein the thermoplastic is liquid crystal polymer (LCP).

13. The semiconductor device of claim 1 further comprising a silicon nitride layer deposited on the first surface between the polymer and semiconductor stack structure.

14. The semiconductor device of claim 13 wherein a thickness of the silicon nitride layer ranges from greater than 100 Å to around about 5000 Å.

15. The semiconductor device of claim 1 wherein the first surface has a roughness range of around about 0.1 nanometers root mean square (RMS) to around about 2 nanometers RMS.

16. The semiconductor device of claim 1 further including a flip chip bump disposed onto the at least one electrical contact.

17. A semiconductor device comprising:
a semiconductor stack structure including at least one device terminal of a semiconductor device, and having a first surface and a second surface, wherein the second surface is an external surface of a buried oxide (BOX) layer that is on an opposite side of the semiconductor stack structure from the first surface;
at least one electrical contact that is electrically coupled to the at least one device terminal and extending outward from the second surface; and
a polymeric layer having a thermal conductivity of at least 2 W/mK and an electrical resistivity of at least $10^6$ Ohm-cm disposed on the first surface of the semiconductor stack structure.

18. The semiconductor device of claim 17 wherein the polymeric layer comprises a polymer and an admixture.

19. The semiconductor device of claim 18 wherein the admixture is boron nitride powder having a concentration ratio that ranges from around about 1% to around about 75% of the polymeric layer.

20. The semiconductor device of claim 18 wherein the admixture is aluminum nitride powder having a concentration ratio that ranges from around about 1% to around about 75% of the polymeric layer.

21. The semiconductor device of claim 18 wherein the admixture is carbon nano structures.

22. The semiconductor device of claim 1 wherein the polymer comprises a polysulfone compound.

23. The semiconductor device of claim 1 wherein the polymer is a thermoplastic.

24. The semiconductor device of claim 23 wherein the thermoplastic is liquid crystal polymer (LCP).

25. The semiconductor device of claim 1 further including a flip-chip bump disposed onto the at least one electrical contact.

* * * * *